US010546900B2

(12) United States Patent
Jeon et al.

(10) Patent No.: US 10,546,900 B2
(45) Date of Patent: Jan. 28, 2020

(54) EDGE BENDING DISPLAY PANEL AND EDGE BENDING DISPLAY DEVICE HAVING THE SAME

(71) Applicant: Samsung Display Co., Ltd., Yongin-si, Gyeonggi-do (KR)

(72) Inventors: Pyungeun Jeon, Seoul (KR); Ilsoo Oh, Seoul (KR); Jihwan Yoon, Yongin-si (KR); Bora Lee, Hwaseong-si (KR); Jehong Choi, Suwon-si (KR); Sangwoo Pyo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 136 days.

(21) Appl. No.: 15/799,219

(22) Filed: Oct. 31, 2017

(65) Prior Publication Data
US 2018/0247985 A1   Aug. 30, 2018

(30) Foreign Application Priority Data

Feb. 28, 2017 (KR) .......................... 10-2017-0026461

(51) Int. Cl.
*H01L 27/32* (2006.01)
*H01L 27/15* (2006.01)
*G09G 5/00* (2006.01)

(52) U.S. Cl.
CPC ........ *H01L 27/3218* (2013.01); *H01L 27/156* (2013.01); *H01L 27/3213* (2013.01); *H01L 27/3216* (2013.01); *G09G 5/003* (2013.01); *G09G 2310/08* (2013.01); *G09G 2320/0242* (2013.01)

(58) Field of Classification Search
CPC ............. H01L 27/3218; H01L 51/0097; H01L 27/3216; H01L 27/156; H01L 27/3213; H01L 2251/5338; G09G 3/20; G09G 2310/0232; G09G 2300/0452; G09G 2320/0242; G09G 2310/08; G09G 5/003
See application file for complete search history.

(56) References Cited

U.S. PATENT DOCUMENTS

| 2014/0264290 | A1* | 9/2014 | Brown ................ H01L 27/3223 257/40 |
| 2014/0300529 | A1* | 10/2014 | Kim ...................... H01L 27/326 345/80 |
| 2014/0320543 | A1* | 10/2014 | Oh ........................ H01L 27/326 345/690 |

FOREIGN PATENT DOCUMENTS

| CN | 103713436 A | * | 4/2014 |
| KR | 10-2008-0067488 A | | 7/2008 |
| KR | 10-2012-0134222 A | | 12/2012 |

* cited by examiner

*Primary Examiner* — Abhishek Sarma
(74) *Attorney, Agent, or Firm* — Lewis Roca Rothgerber Christie LLP

(57) ABSTRACT

A bent edge display panel including a flat area in which pixel groups are repeatedly formed in a first direction and in a second direction perpendicular to the first direction, each of the pixel groups including a first pixel, a second pixel, and a third pixel, and a bending area extending and being bent from the flat area along the first direction, wherein a pixel group from among the pixel groups and a compensating pixel are in the bending area.

20 Claims, 11 Drawing Sheets

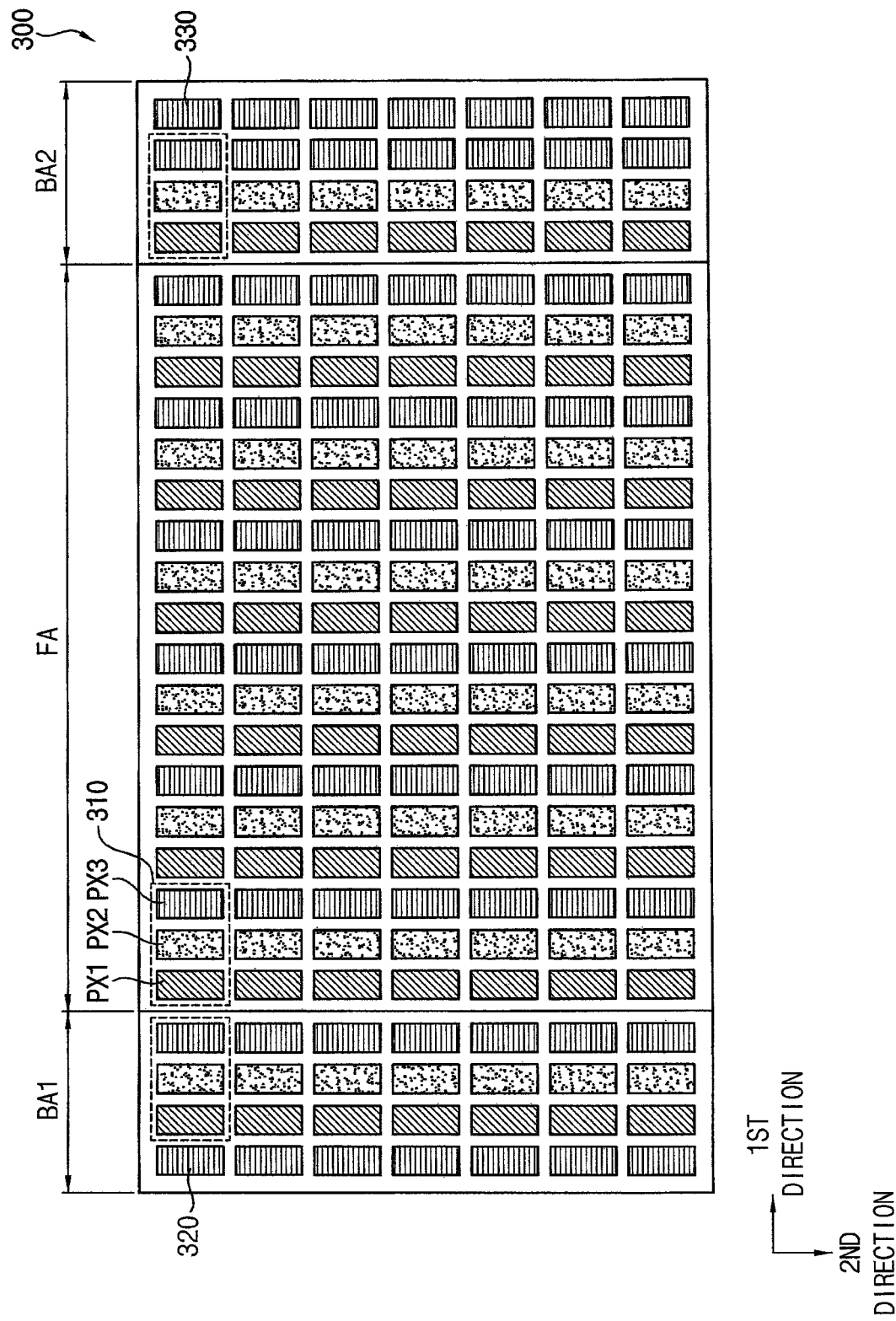

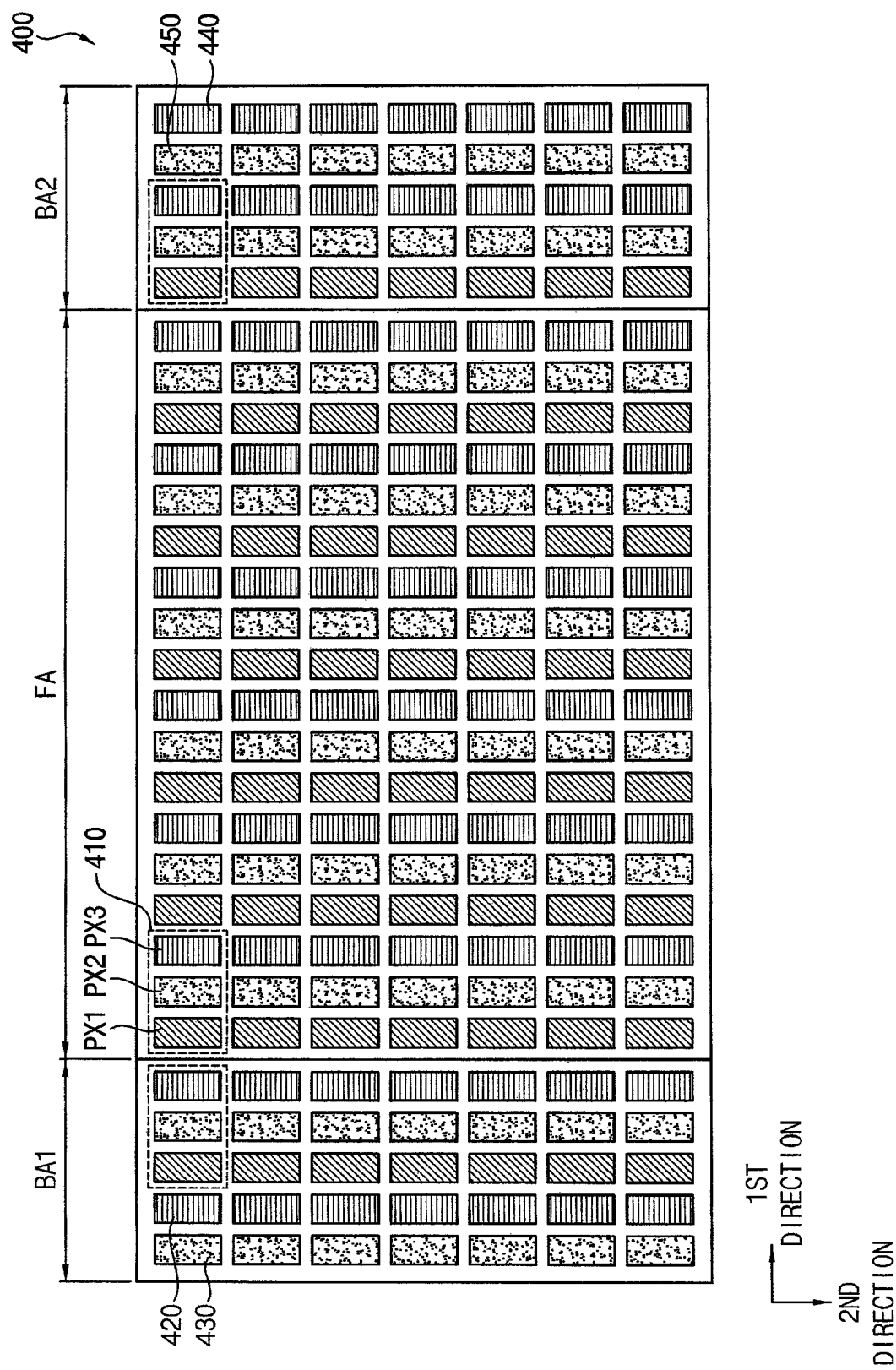

EDGE BENDING DISPLAY PANEL AND EDGE BENDING DISPLAY DEVICE HAVING THE SAME

CROSS-REFERENCE TO RELATED APPLICATION

This application claims priority to and the benefit of Korean Patent Application No. 10-2017-0026461, filed on Feb. 28, 2017 in the Korean Intellectual Property Office (KIPO), the content of which is incorporated herein in its entirety by reference.

BACKGROUND

1. Field

Aspects of the present invention relate generally to an edge bending display panel and an edge bending display device having the same.

2. Description of the Related Art

Recently, bending display devices that have bendable substrates have become a subject of much study. These display devices improve the convenience of using electric devices and improve screen immersion. Studies for improving display quality of such devices are underway.

SUMMARY

Aspects of some example embodiments are directed to an edge bending display panel capable of displaying an image having uniform display quality in a flat area and a bending area.

According to an aspect of example embodiments, there is provided a bent edge display panel including: a flat area in which pixel groups are repeatedly formed in a first direction and in a second direction perpendicular to the first direction, each of the pixel groups including a first pixel, a second pixel, and a third pixel; and a bending area extending and being bent from the flat area along the first direction, wherein a pixel group from among the pixel groups and a compensating pixel are in the bending area.

In an embodiment, the compensating pixel emits the same color light as one of the first pixel, the second pixel, and the third pixel.

In an embodiment, a size of the compensating pixel is the same as a size of the first pixel, a size of the second pixel, and a size of the third pixel.

In an embodiment, a size of the compensating pixel is different from a size of the first pixel, a size of the second pixel, and a size of the third pixel.

In an embodiment, the first, second, and third pixels have the same size as each other.

In an embodiment, each of the first pixel, the second pixel, and the third pixel has a rectangular shape, and the first pixel, the second pixel, and the third pixel are sequentially arranged in the first direction.

In an embodiment, the pixel group further includes: a fourth pixel having the same size as the first pixel, the second pixel, and the third pixel.

In an embodiment, the compensating pixel emits the same color light as one of the first pixel, the second pixel, the third pixel, and the fourth pixel.

In an embodiment, each of the first pixel, the second pixel, the third pixel, and the fourth pixel has a rectangular shape, and the first pixel, the second pixel, the third pixel, and the fourth pixel are sequentially arranged in the first direction.

In an embodiment, the first, second, and third pixels have different sizes from each other.

In an embodiment, each of the first pixel, the second pixel, and the third pixel has a diamond shape, and the first pixel, the second pixel, and the third pixel are arranged in the first direction and the second direction.

In an embodiment, each of the first pixel, the second pixel, and the third pixel has a rectangular shape, and the first pixel, the second pixel, and the third pixel are arranged in the first direction and the second direction.

In an embodiment, the pixel groups are arranged in a stripe structure.

In an embodiment, the pixel groups are arranged in a pentile structure.

According to an aspect of example embodiments, there is provided a bent edge display device including: an bent edge display panel including a flat area in which a first pixel, a second pixel, and a third pixel are repeatedly located in a first direction and in a second direction perpendicular to the first direction, and further including a bending area extending and being bent from the flat area in the first direction; a data driver configured to provide a data signal to the bent edge display panel; a scan driver configured to provide a scan signal to the bent edge display panel; and a timing controller configured to generate control signals that control the data driver and the scan driver, wherein a pixel group and a compensating pixel are in the bending area, the pixel group including the first, second, and third pixels.

In an embodiment, the compensating pixel emits the same color light as one of the first pixel, the second pixel, and the third pixel.

In an embodiment, a size of the compensating pixel is the same as a size of the first pixel, a size of the second pixel, and a size of the third pixel.

In an embodiment, a size of the compensating pixel is different from a size of the first pixel, a size of the second pixel, and a size of the third pixel.

In an embodiment, the pixel group is arranged in a stripe structure.

In an embodiment, the pixel group is arranged in a pentile structure.

Therefore, an edge bending display panel and an edge bending display device may decrease a color difference and a brightness difference between a flat area and a bending area by including a pixel group in the flat area of the edge bending display panel and including a further pixel group and a compensating pixel in the bending area of the edge bending display panel. Thus, display quality of the edge bending display panel may be improved.

BRIEF DESCRIPTION OF THE DRAWINGS

Illustrative, non-limiting example embodiments will be more clearly understood from the following detailed description taken in conjunction with the accompanying drawings.

FIGS. 2-8 are plan views illustrating pixel structures of the edge bending display panel of FIGS. 1A and 1B, according to some example embodiments of the present invention.

DETAILED DESCRIPTION

Hereinafter, the present inventive concept will be explained in detail with reference to the accompanying drawings.

Figure 1A:
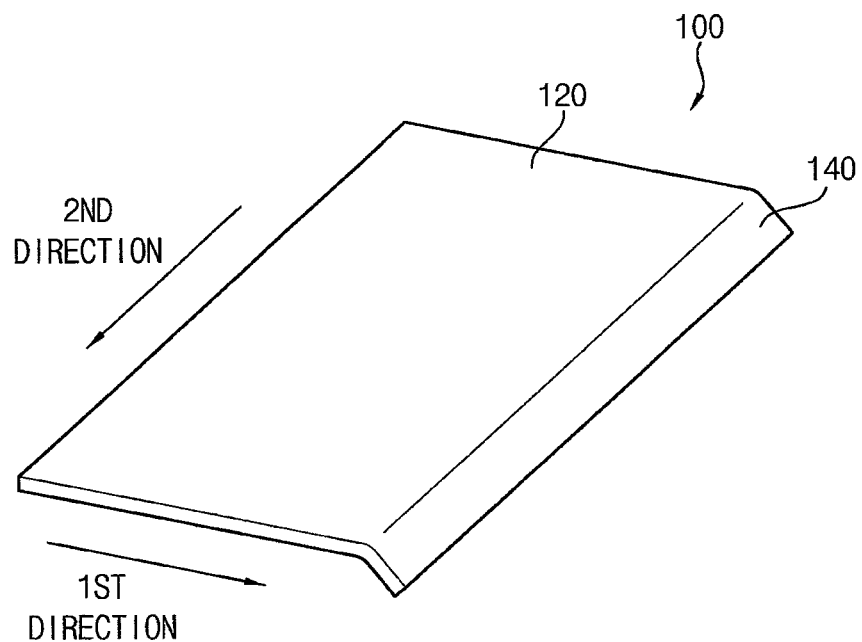
FIGS. 1A-1B are perspective views illustrating an edge bending display panel according to some example embodiments of the present invention.
Figure 1B:
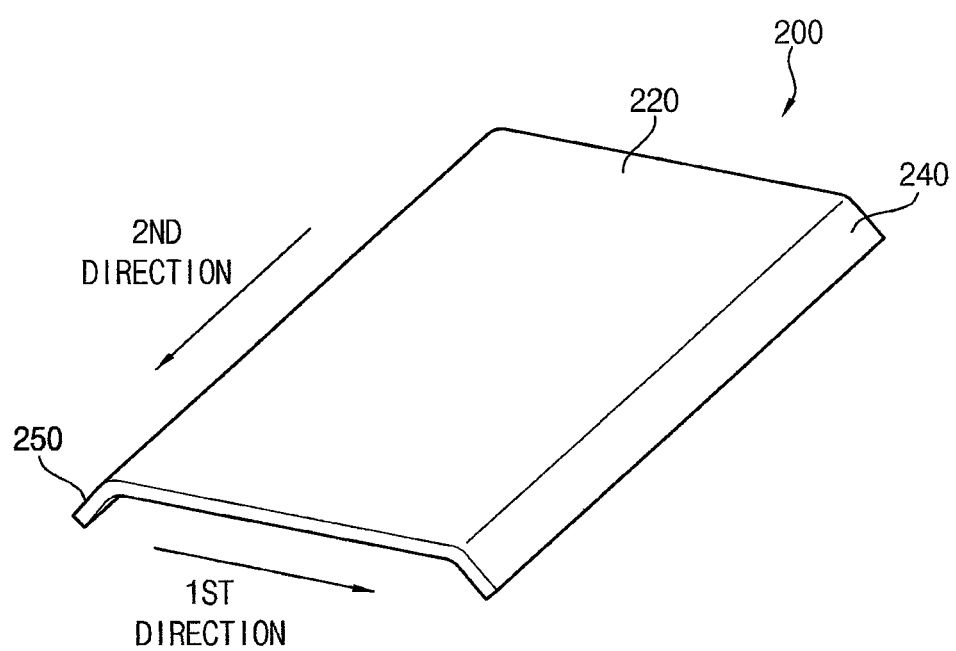

FIGS. 1A and 1B are perspective views illustrating an edge bending display panel according to some example embodiments of the present invention.

Referring to FIG. 1A, an edge bending display panel 100 may include a flat area 120 and a bending area 140.

Pixel groups that include a first pixel, a second pixel, and a third pixel may be formed in a first direction 1ST DIRECTION and in a second direction 2ND DIRECTION crossing (e.g., perpendicular to) the first direction 1ST DIRECTION. For example, the first pixel may be a red pixel that emits a red color light (e.g., displays a red color), the second pixel may be a green pixel that emits a green color light (e.g., displays a green color), and the third pixel may be a blue pixel that emits a blue color light (e.g., displays a blue color).

The pixel groups may be arranged in a stripe structure as illustrated in FIGS. 2 through 5. The pixel group having the stripe structure may include the first pixel, the second pixel, and the third pixel of which sizes are the same. For example, the first pixel, the second pixel, and the third pixel may be formed in a rectangular shape and be sequentially arranged in the first direction 1ST DIRECTION.

Figure 6:
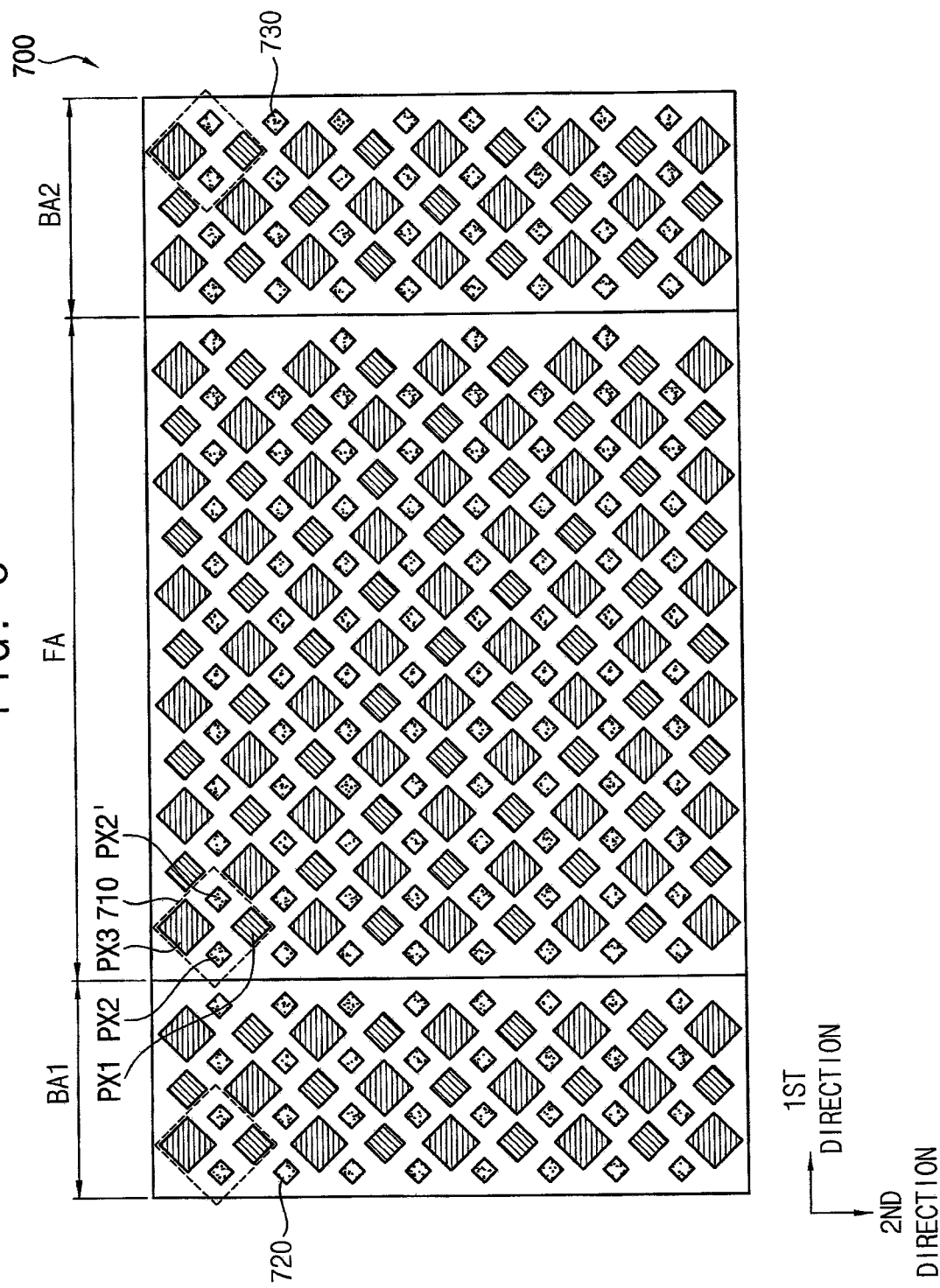
Figure 7:
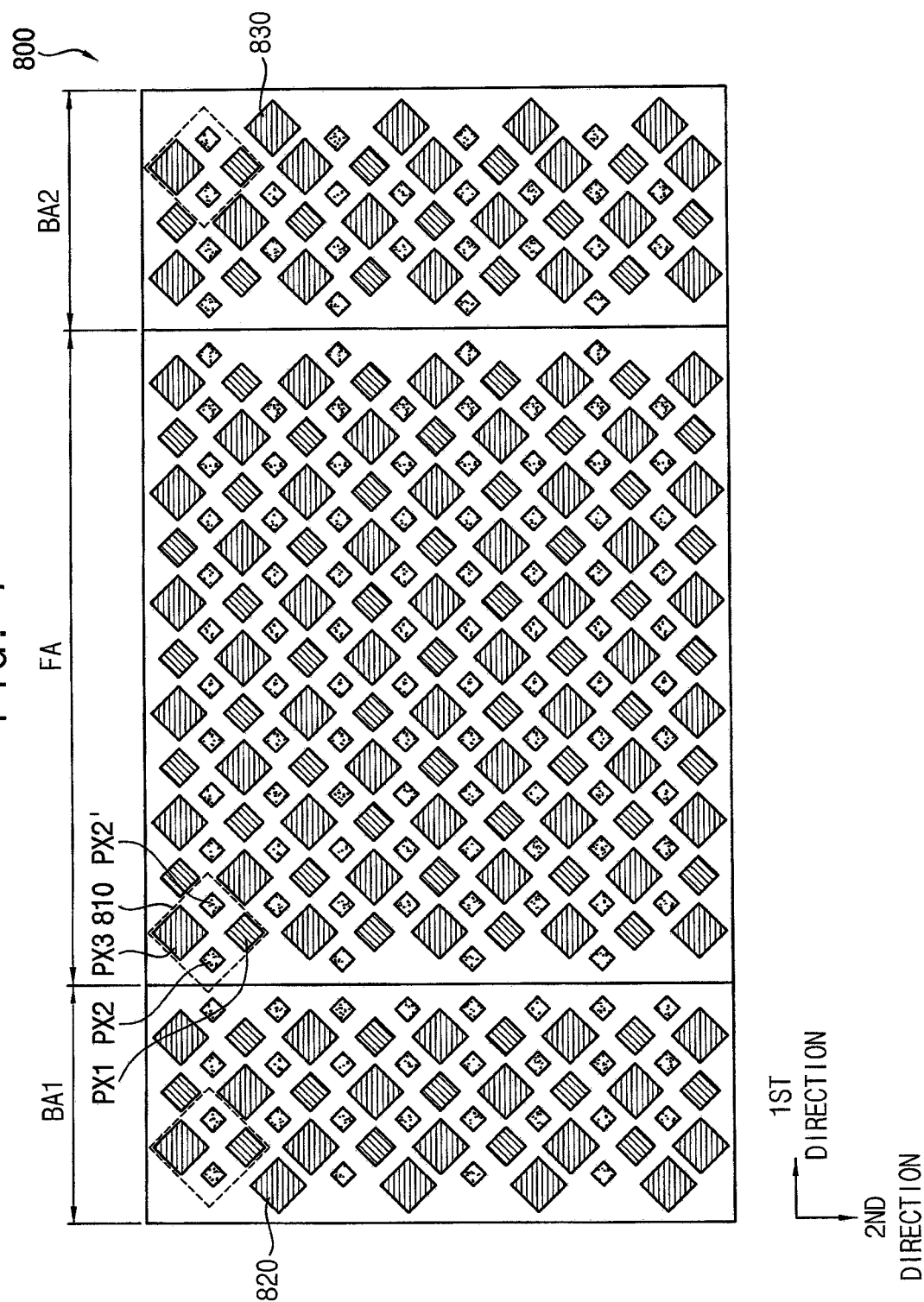
Figure 8:
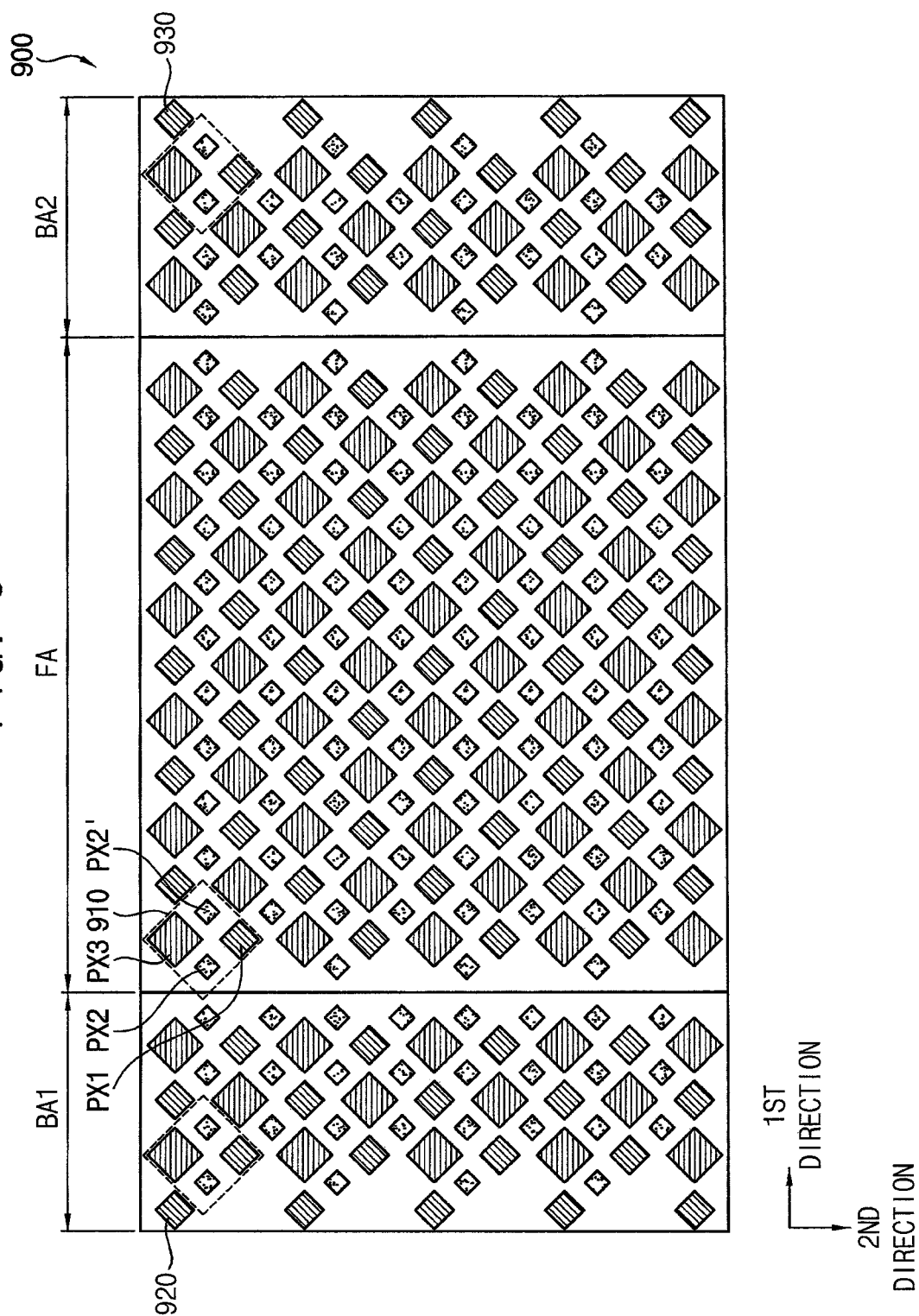

The pixel groups may also be arranged in a pentile structure as illustrated in FIGS. 6 through 8. The pixel group having the pentile structure may include the first pixel, the second pixel, and the third pixel of which sizes are the same. In some examples, the pixel group having the pentile structure may include the first pixel, the second pixel, and the third pixel, which have different sizes. For example, the first pixel, the second pixel, and the third pixel may be formed in a diamond shape and be arranged in the first direction 1ST DIRECTION and in the second direction 2ND DIRECTION. The pixel group may further include a fourth pixel. For example, the fourth pixel may be a white pixel that emits a white color light (e.g., display a white color).

The bending area 140 may be formed in an extended area of the flat area 120 along the first direction 1ST DIRECTION. The bending area 140 may be flexible. The pixel group and at least one compensating pixel may be formed in the bending area 140. Display quality of the flat area 120 and display quality of the bending area 140 may be different depending on the viewing angle of a user. For example, an image displayed at the bending area 140 may look reddish or yellowish or bluish when the display panel is, for example, viewed from a direction orthogonal to the flat area 120. The edge bending display panel (e.g., the bent edge display panel) 100 may improve the display quality of the bending area 140 by including the compensating pixel. For example, when the pixels of the bending area 140 appear to have a red color, the compensating pixel that emits a blue color light may be formed in the bending area 140. Further, when the pixels of the bending area 140 appear to have a violet color, the compensating pixel that emits a green color light may be formed in the bending area 140. The compensating pixel may be the same as one of the first pixel, the second pixel, and the third pixel. In some example embodiments, a size of the compensating pixel may be the same as the size of the first, second, and third pixels. In other example embodiments, the size of the compensating pixel may be different from the size of the first, second, and third pixels.

Referring to FIG. 1B, an edge bending display panel 200 may include a flat area 220, a first bending area 240, and a second bending area 250. In some example embodiments, the first bending area 240 and the second bending area 250 may have the same or substantially the same structure. For example, when the pixels of the first bending area 240 and the second bending area 250 appear to have a red color, the compensating pixel that emits a blue color light may be formed in the first bending area 240 and the second bending area 250. In other example embodiments, the first bending area 240 and the second bending area 250 may have different structures. For example, when the pixels of the first bending area 240 appear to have a red color and the pixels of the second bending area 250 appear to have a blue color, the compensating pixel that emits blue color light may be formed in the first bending area 240 and the compensating pixel that emits a red color light may be formed in the second bending area 250.

As described above, the edge bending display panel 100, 200 may decrease color difference between the flat area 120, 220 and the bending area 140, 240 250 by forming the compensating pixel in the bending area 140, 240, 250. Thus, the display quality of the edge bending display panel 100, 200 may be improved.

FIGS. 2 through 8 are plan views illustrating pixel structures of the edge bending display panel of FIGS. 1A and 1B, according to some example embodiments of the present invention.

Referring to FIG. 2, an edge bending display panel 300 may include a flat area FA, a first bending area BA1, and a second bending area BA2. Although the edge bending display panel 300 that includes the first bending area BA1 and the second bending area BA2 is described with reference to FIG. 2, the edge bending display panel according to other embodiments may include only one bending area.

A plurality of pixel groups 310 may be repeatedly formed in a first direction 1ST DIRECTION and in a second direction 2ND DIRECTION in the flat area FA. Each of the pixel group 310 may include a first pixel PX1, a second pixel PX2, and a third pixel PX3. A size of the first pixel PX1, a size of the second pixel PX2, and a size of the pixel PX3 may be the same. Further, the first pixel PX1, the second pixel PX2, and the third pixel PX3 may have a rectangular shape. The first pixel PX1, the second pixel PX2, and the third pixel PX3 may be sequentially arranged along the first direction 1ST DIRECTION. For example, the first pixel PX1 may be a red pixel that emits a red color light, the second pixel PX2 may be a green pixel that emits a green color light, and the third pixel PX3 may be a blue pixel that emits a blue color light.

The pixel groups 310 and compensating pixels 320, 330 may be formed in the first bending area BA1 and the second bending area BA2. The pixel groups 310 and the compensating pixels 320, 330 may be repeatedly arranged along the second direction 2ND DIRECTION. The compensating pixels 320, 330 may be formed at the edges of the first bending area BA1 and the second bending area BA2. The compensating pixels 320, 330 may be the same as one of the first pixel PX1, the second pixel PX2, and the third pixel PX3. For example, the compensating pixels 320, 330 may be pixels that are the same as (e.g., emit the same color light as)

the third pixel PX3 as described with reference to FIG. 2. Although the compensating pixels 320, 330 are the same as the third pixel PX3 described with reference to FIG. 2, the compensating pixels 320, 330 are not limited thereto. For example, the compensating pixels 320, 330 may be the same as the first pixel PX1 or the second pixel PX2. The pixel group 310 and the compensating pixels 320, 330 may be arranged along the first direction 1ST DIRECTION, even though the pixel groups 310 and the compensating pixels 320, 330 arranged along the second direction 2ND DIRECTION is described with reference to FIG. 2. Although the first bending area BA1 and the second bending area BA2 that include the same compensating pixels 320, 330 are described with reference to FIG. 2, the first bending area BA1 and the second bending area BA2 are not limited thereto. For example, the first bending area BA1 may include the compensating pixel 320 that is the same as the first pixel PX1, and the second bending area BA2 may include the compensating pixel 330 that is the same as the third pixel PX3.

Referring to FIG. 3, pixel groups 410 and compensating pixels 420, 430, 440, 450 may be formed in a first bending area BA1 and a second bending area BA2 of an edge bending display panel 400. The pixel groups 410 and the compensating pixels 420, 430, 440, 450 may be repeatedly formed along the second direction 2ND DIRECTION. The compensating pixels 420, 430, 440, 450 may be formed at the edges of the first bending area BA1 and the second bending area BA2. The compensating pixels 420, 430, 440, 450 may be the same as (e.g., emit the same color light as) one of the first pixel PX1, the second pixel PX2, and the third pixel PX3. The first bending area BA1 and the second bending area BA2 may include the compensating pixels 430, 450 that are the same as the second pixel PX2 and the compensating pixels 420, 440 that are the same as the third pixel PX3 as described with reference to FIG. 3. Further, the first bending area BA1 and the second bending area BA2 may have different structures even though the first bending area BA1 and the second bending area BA2 having the same structure are described with reference to FIG. 3. For example, the first bending area BA1 may include the compensating pixels 420, 430 that are the same as the second pixel PX2 and the third pixel PX3, and the second bending area BA2 may include the compensating pixels 440, 450 that are the same as the first pixel PX1 and the third pixel PX3.

Figure 4:
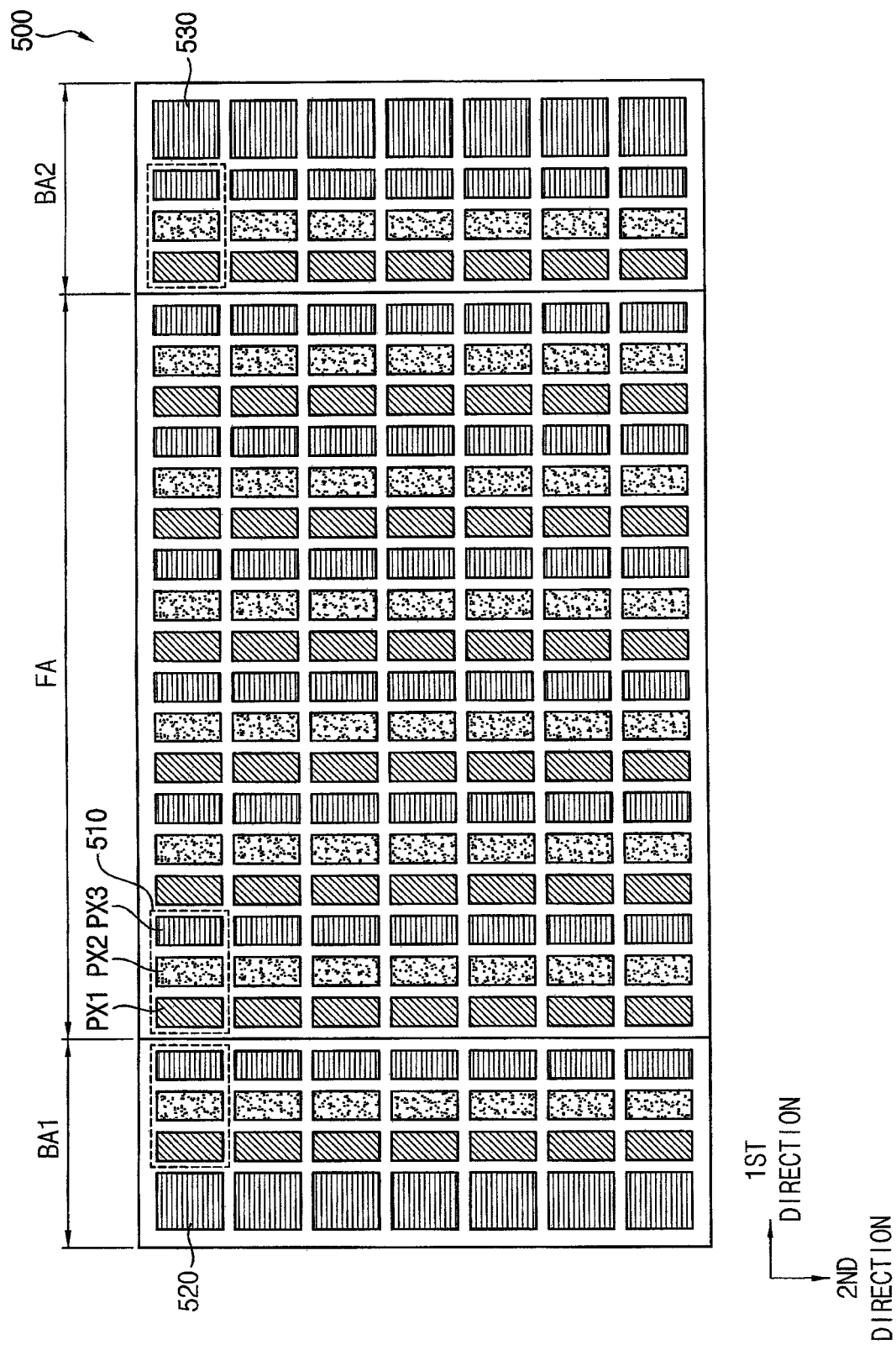

Referring to FIG. 4, pixel groups 510 and compensating pixels 520, 530 may be formed in a first bending area BA1 and a second bending area BA2. The pixel groups 510 and the compensating pixels 520, 530 may be repeatedly arranged along the second direction 2ND DIRECTION. The compensating pixels 520, 530 may be formed at the edges of the first bending area BA1 and the second bending area BA2. The compensating pixels 520, 530 may be the same as one of the first pixel PX1, the second pixel PX2, and the third pixel PX3. The first bending area BA1 and the second bending area BA2 may include the compensating pixels 520, 530 that are the same as the third pixel PX3. Here, a size of the compensating pixels 520, 530 may be bigger than a size of the first pixel PX1, a size of the second pixel PX2, and a size of the third pixel PX3. The size of the compensating pixels 520, 530 may be changed based on the display quality of the first bending area BA1 and the second bending area BA2. For example, the size of the compensating pixels 520, 530 may increase as the first bending area BA1 and the second bending area BA2 come to appear reddish. Further, the first bending area BA1 and the second bending area BA2 may have different structures even though the first bending area BA1 and the second bending area BA2 having the same structure are described with reference to FIG. 4. For example, when the first bending area BA1 appears more reddish than the second bending area BA2, the size of the compensating pixel 520 formed in the first bending area BA1 may be bigger than the size of the compensating pixel 530 formed in the second bending area BA2.

Figure 5:
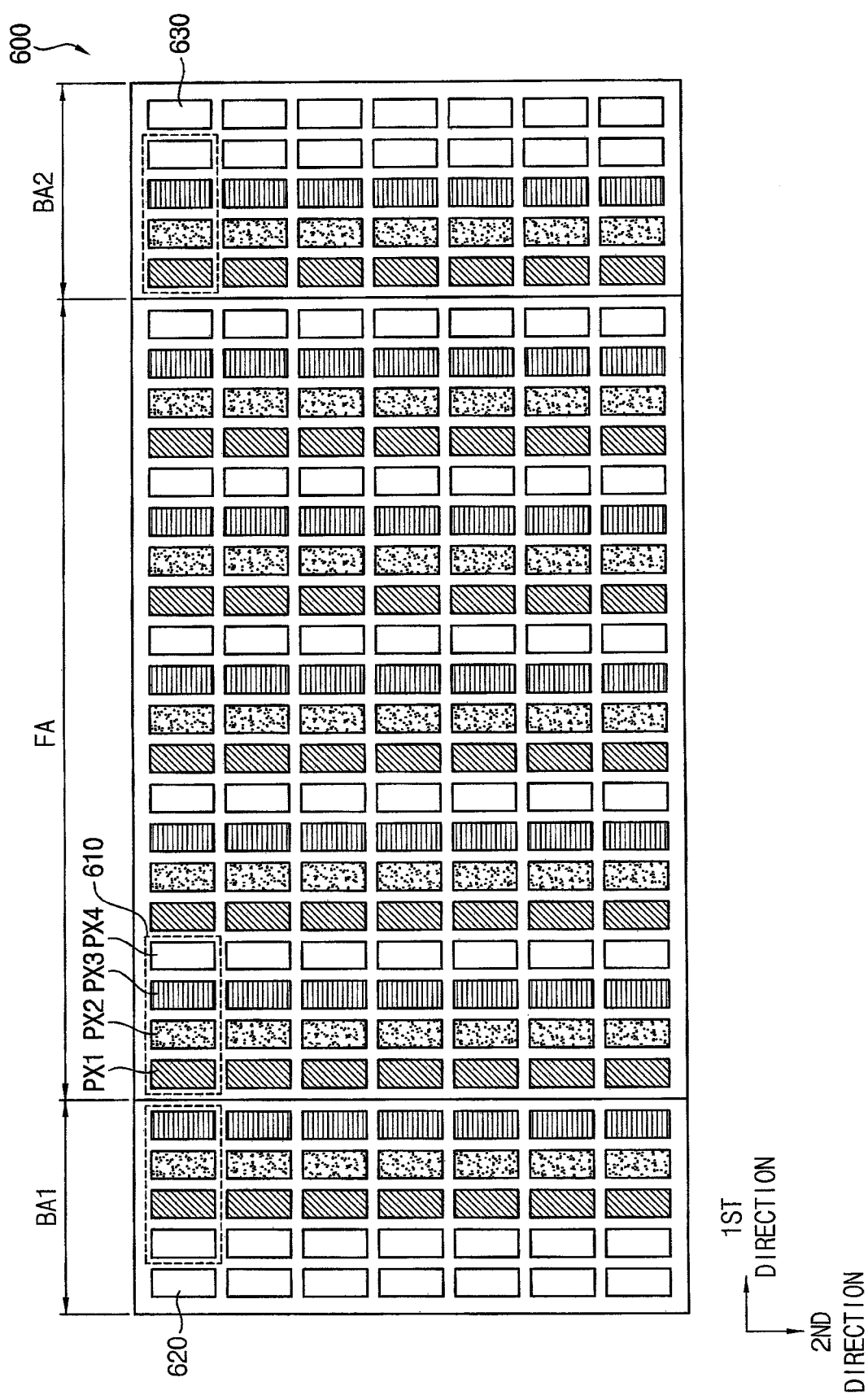

Referring to FIG. 5, pixel groups 610 and compensating pixels 620, 630 may be formed in a first bending area BA1 and a second bending area BA2. The pixel groups 610 and the compensating pixels 620, 630 may be repeatedly arranged along the second direction 2ND DIRECTION. Each of the pixel groups 610 may include a first pixel PX1, a second pixel PX2, a third pixel PX3, and a fourth pixel PX4. For example, the first pixel PX1 may be a red pixel that emits a red color light, the second pixel PX2 may be a green pixel that emits a green color light, the third pixel PX3 may be a blue pixel that emits a blue color light, and the fourth pixel PX4 may be a white pixel that emits a white color light. The compensating pixels 620, 630 may be formed at the edges of the first bending area BA1 and the second bending area BA2. The compensating pixels 620, 630 may be the same as one of the first pixel PX1, the second pixel PX2, the third pixel PX3, and the fourth pixel PX4. The compensating pixels 620, 630 may be the same as the fourth pixel PX4 as described with reference to FIG. 5. Brightness of the first bending area BA1 and the second bending area BA2 may increase when the first bending area BA1 and the second bending area BA2 include the compensating pixels 620, 630 that emits the white color light. Although the compensating pixels 620, 630 that are the same as the fourth pixel PX4 are described with reference to FIG. 5, the compensating pixels 620, 630 are not limited thereto. For example, the compensating pixels 620, 630 may be the same as the first pixel PX1 or the second pixel PX2 or the third pixel PX3. Further, although the compensating pixels 620, 630 of which sizes are the same as the first pixel PX1, the second pixel PX2, and the third pixel PX3 are described with reference to FIG. 5, the size of the compensating pixels are not limited thereto. More than two compensating pixels 620, 630 may be formed in the first bending area BA1 and the second bending area along the first direction 1ST DIRECTION. Although the first bending area BA1 and the second bending area BA2 in which the compensating pixels 620, 630 are the same are described with reference to FIG. 5, the first bending area BA1 and the second bending area BA2 are not limited thereto. For example, the first bending area BA1 may include the compensating pixel 620 that emits the white color light and the second bending area BA2 may include the compensating pixel 630 that emits a blue color light.

Referring to FIG. 6, an edge bending display panel 700 may include a flat area FA, a first bending area BA1, and a second bending area BA2. A plurality of pixel groups 710 may be repeatedly formed in a first direction 1ST DIRECTION and in a second direction 2ND DIRECTION in the flat area FA. Each of the pixel groups 710 may include a first pixel PX1, second pixels PX2, PX2', and a third pixel PX3. The first pixel PX1, the second pixels PX2, PX2', and the third pixel PX3 may have different sizes. As described with reference to FIG. 6, the first pixel PX1, the second pixels PX2, PX2', and the third pixel PX3 may have a diamond shape. The first pixel PX1, the second pixels PX2, PX2', and the third pixel PX3 may be sequentially arranged along the first direction 1ST DIRECTION and the second direction 2ND DIRECTION. For example, the first pixel PX1 may be a red pixel that emits a red color light, the second pixels PX2, PX2' may be a green pixel that emits a green color light, and the third pixel PX3 may be a blue pixel that emits a blue color light.

The pixel groups 710 and compensating pixels 720, 730 may be formed in the first bending area BA1 and the second bending area BA2. The pixel groups 710 and the compensating pixels 720, 730 may be repeatedly arranged along the second direction 2ND DIRECTION. The compensating pixels 720, 730 may be formed at the edges of the first bending area BA1 and the second bending area BA2. The compensating pixels 720, 730 may be the same as one of the first pixel PX1, the second pixels PX2, PX2', and the third pixel PX3. For example, the compensating pixels 720, 730 may be pixels that are the same as (e.g., emit the same color lights as) the second pixel PX2, PX2' as described with reference to FIG. 6. When the compensating pixels 720, 730 that are the same as the second pixels PX2, PX2' are formed in the first bending area BA1 and the second bending area BA2, the phenomenon of the first bending area BA1 and the second bending area BA2 appearing to have a violet color may be reduced (e.g., alleviated). The first bending area BA1 and the second bending area BA2 may further include the compensation pixels. For example, each of the first bending area BA1 and the second bending area BA2 may include compensating pixels that emits the red color light and a compensating pixel that emits a green color light when the first bending area BA1 and the second bending area BA2 have the blue color.

Although the first pixel PX1, the second pixels PX2, PX2', and the third pixel PX3 having the diamond shape are described with reference to FIG. 6, the shape of the first pixel PX1, the second pixels PX2, PX2', and the third pixel PX3 is not limited thereto. For example, the first pixel PX1, the second pixels PX2, PX2', and the third pixel PX3 may have the rectangular shape of which sizes are different from each other.

Referring to FIG. 7, pixel groups 810 and compensating pixels 820, 830 may be formed in a first bending area BA1 and a second bending area BA2. The pixel groups 810 and the compensating pixels 820, 830 may be repeatedly arranged along the second direction 2ND DIRECTION. The compensating pixels 820, 830 may be formed at the edges of the first bending area BA1 and the second bending area BA2. The compensating pixels 820, 830 may be the same as one of the first pixel PX1, the second pixels PX2, PX2', and the third pixel PX3. For example, the compensating pixels 820, 830 may be pixels that are the same as (e.g., emit the same color lights as) the third pixel PX3 as described with reference to FIG. 7. When the compensating pixels 820, 830 same as the third pixel PX3 are formed in the first bending area BA1 and the second bending area BA2, the phenomenon the first bending area BA1 and the second bending area BA2 appearing to have a yellow color may be reduced (e.g., alleviated).

Referring to FIG. 8, pixel groups 910 and compensating pixels 920, 930 may be formed in a first bending area BA1 and a second bending area BA2. The pixel groups 910 and the compensating pixels 920, 930 may be repeatedly arranged along the second direction 2ND DIRECTION. The compensating pixels 920, 930 may be formed at the edges of the first bending area BA1 and the second bending area BA2. For example, the compensating pixels 920, 930 may be pixels that are the same as (e.g., emit the same color lights as) the first pixel PX1 as described with reference to FIG. 8. When the compensating pixels 920, 930 that are the same as the first pixel PX1 are formed in the first bending area BA1 and the second bending area BA2, phenomenon the first bending area BA1 and the second bending area BA2 have blue color may be reduced.

Figure 9:
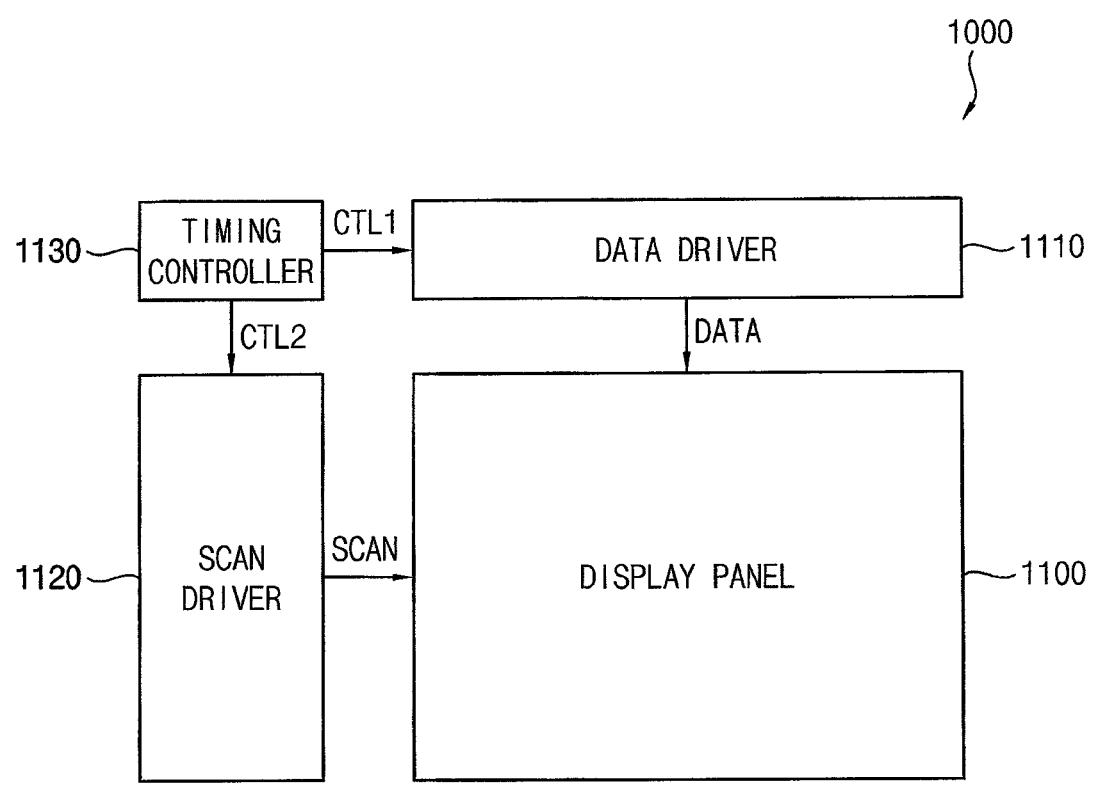
FIG. 9 is a block diagram illustrating an edge bending display device according to some example embodiments of the present invention.

FIG. 9 is a block diagram illustrating an edge bending display device according to some example embodiments of the present invention.

Referring to FIG. 9, an edge bending display device (e.g., a bent-edge display device) 1000 may include an edge bending display panel (e.g., a bent-edge display panel) 1100, a data driver 1110, a scan driver 1120, and a timing controller 1130.

The edge bending display panel 1100 may include a flat area and a bending area. A plurality of pixel groups that include a first pixel, a second pixel, and a third pixel may be repeatedly formed in the flat area of the edge bending display panel 1100 in a first direction and in a second direction. For example, the first pixel may be a red pixel that emits a red color light, the second pixel may be a green pixel that emits a green color light, and the third pixel may be a blue pixel that emits a blue color light. The pixel group may have a stripe structure in which the first pixel, the second pixel, and the third pixel are formed in a rectangular shape and have the same size. Further, the pixel group may have a pentile structure in which the first pixel, the second pixel, and the third pixel are formed in a diamond shape and have different sizes.

The bending area may be formed in an extended area of the flat area. The edge bending display panel 1100 may include at least one bending area. The pixel group and at least one compensating pixel may be formed in the bending area of the edge bending display panel 1100. Here, the compensating pixel may be the same as one of the first pixel, the second pixel, and the third pixel. A size of the compensating pixel may be the same as the first pixel, the second pixel, and the third pixel. Alternately, the size of the compensating pixel may be different from the first pixel, the second pixel, and the third pixel.

The pixel group may further include a fourth pixel. The fourth pixel may be a white pixel that emits a white color light. When the pixel group includes the fourth pixel, the compensating pixel may be the same as one of the first pixel, the second pixel, the third pixel, and the fourth pixel.

The scan driver 1120 may provide a scan signal SCAN to the first pixel, the second pixel, the third pixel, and the fourth pixel included in the edge bending display panel 110. The data driver 1110 may provide the data signal DATA to the first pixel, the second pixel, the third pixel, and the fourth pixel in response to the scan signal SCAN. The timing controller 1130 may generate control signals CTL1, CTL2 that control the scan driver 1120 and the data driver 1110.

As described above, the edge bending display device 1000 may decrease a color difference and a brightness difference of the flat area and the bending area by including the edge bending display panel 1100 that includes at least one compensating pixel. Thus, display quality of an image displayed on the edge bending display device 1000 may be improved.

Figure 10:
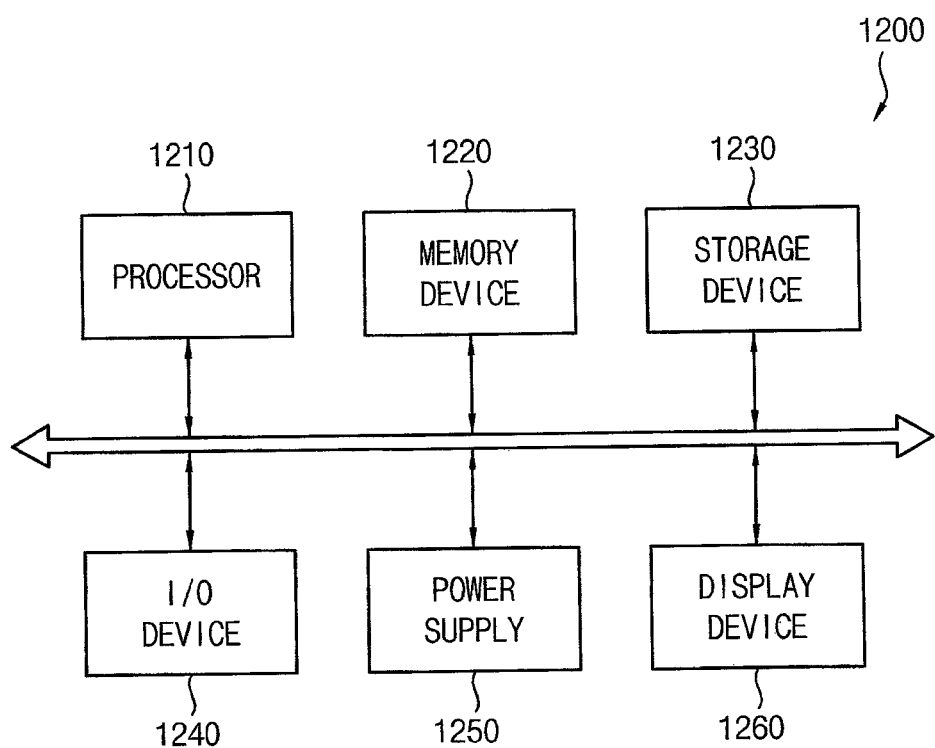
FIG. 10 is a block diagram illustrating an electronic device including the edge bending device of FIG. 9, according to some embodiments of the present invention.
Figure 11:
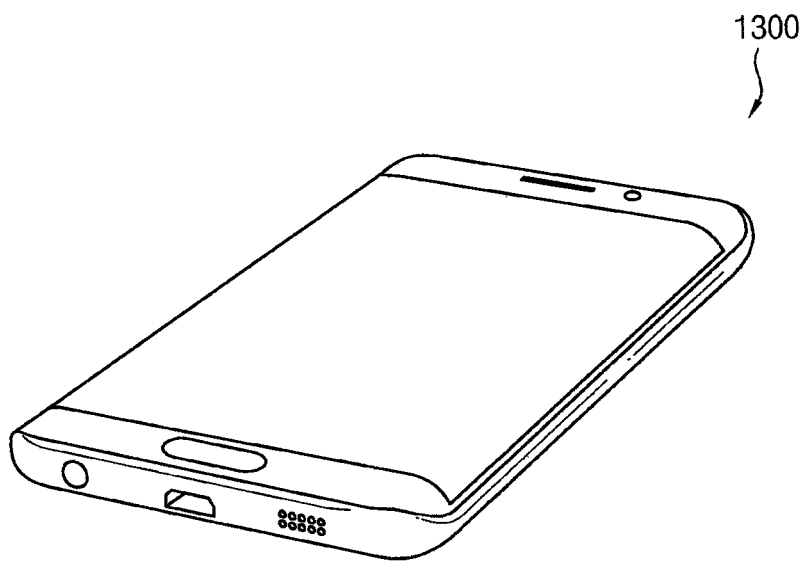
FIG. 11 is a block diagram illustrating an example embodiment in which the electronic device of FIG. 10 is implemented as a smart phone.

FIG. 10 is a block diagram illustrating an electronic device including the edge bending device of FIG. 9, according to some embodiments of the present invention. FIG. 11 is a block diagram illustrating an example embodiment in which the electronic device of FIG. 10 is implemented as a smart phone.

Referring to FIGS. 10 and 11, an electronic device 1200 may include a processor 1210, a memory device 1220, a storage device 1230, an input/output (I/O) device 1240, a power device 1250, and a display device 1260. Here, the display device 1260 may correspond to the edge bending display device 800 of FIG. 9 or any other suitable bent-edge display device disclosed herein. In addition, the electronic device 1200 may further include a plurality of ports for communicating with a video card, a sound card, a memory card, a universal serial bus (USB) device, and/or other electronic device. Although it is illustrated in FIG. 11 that the electronic device 1200 is implemented as a smart phone 1300, the kind of the electronic device 1200 is not limited thereto.

The processor 1210 may perform various computing functions. The processor 1210 may be a microprocessor, a central processing unit (CPU), or the like. The processor 1210 may be coupled to other components via an address bus, a control bus, a data bus, and/or the like. Further, the processor 1210 may be coupled to an extended bus such as surrounded component interconnect (PCI) bus. The memory device 1220 may store data for operations of the electronic device 1200. For example, the memory device 1220 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, or the like. The storage device 1230 may be a solid stage drive (SSD) device, a hard disk drive (HDD) device, a CD-ROM device, and/or the like.

The I/O device 1240 may be an input device such as a keyboard, a keypad, a touchpad, a touch-screen, a mouse, etc., and an output device such as a printer, a speaker, etc. In some example embodiments, the display device 1260 may be included in the I/O device 1240. The power device 1250 may provide a power for operations of the electronic device 1200. The display device 1260 may communicate with other components via the buses or other communication links. As described above, the display device 1260 may include an edge bending display panel, a data driver, a scan driver, and a timing controller. The edge bending display panel may include a flat area and a bending area. Pixel groups that include a first pixel, a second pixel, and a third pixel may be repeatedly formed in the flat area according to a first direction and a second direction. The pixel groups may be arranged in a stripe structure. The pixel group having the stripe structure may include the first pixel, the second pixel, and the third pixel of which sizes are the same. Here, the first pixel, the second pixel, and the third pixel may have a rectangular shape. Further, the pixel groups may be arranged in a pentile structure. The pixel group having the pentile structure may include the first pixel, the second pixel, and the third pixel of which sizes are different from each other. Here, the first pixel, the second pixel, and the third pixel may have a rectangular shape or a diamond shape. The bending area may be formed in the extended area of the flat area. The pixel group and at least one compensating pixel may be formed in the bending area. Here, the compensating pixel may be the same as one of the first pixel, the second pixel, and the third pixel. In some example embodiments, a size of the compensating pixel may be the same as the size of the first pixel, the size of the second pixel, and the size of the third pixel. In other example embodiments, the size of the compensating pixel may be different from the size of the first pixel, the size of the second pixel, and the size of the third pixel. The scan driver may provide a scan signal to the edge bending display panel through scan lines. The data driver may provide a data signal to the edge bending display panel through data lines according to the scan signal. The timing controller may generate control signals that control the scan driver and the data driver.

As described above, the electronic device 1200 of FIG. 10 may include the edge bending display panel. The edge bending display panel may decrease the appearance of a color difference and a brightness difference between the flat area and the bending area by including at least one compensating pixel in the bending area. Thus, display quality of image displayed on the display device 1260 may be improved.

The present inventive concept may be applied to a display device and an electronic device having the display device. For example, the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, and/or the like.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

In addition, it will also be understood that when an element is referred to as being "between" two elements, it can be the only element between the two elements, or one or more intervening elements may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

The edge bending display device and/or any other relevant devices or components, such as the data driver, the scan driver, and the timing controller, according to embodiments of the present invention described herein may be implemented utilizing any suitable hardware, firmware (e.g. an application-specific integrated circuit), software, or a suitable combination of software, firmware, and hardware. For example, the various components of the edge bending display device may be formed on one integrated circuit (IC) chip or on separate IC chips. Further, the various components of the edge bending display device may be implemented on a flexible printed circuit film, a tape carrier package (TCP), a printed circuit board (PCB), or formed on the same substrate. Further, the various components of the edge bending display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

The foregoing is illustrative of example embodiments and is not to be construed as limiting thereof. Although a few example embodiments have been described, those skilled in the art will readily appreciate that many suitable modifications are possible in the example embodiments without materially departing from the novel teachings and aspects of the present inventive concept. Accordingly, all such modifications are intended to be included within the scope of the present inventive concept as defined by the claims and equivalents thereof.

What is claimed is:

1. A bent edge display device comprising:
   a bent edge display panel comprising a flat area in which a first pixel, a second pixel, a third pixel, and a fourth pixel are repeatedly located in a first direction and in a second direction perpendicular to the first direction, and further comprising a bending area extending and being bent from the flat area in the first direction;
   a data driver configured to provide a data signal to the bent edge display panel;
   a scan driver configured to provide a scan signal to the bent edge display panel; and
   a timing controller configured to generate control signals that control the data driver and the scan driver,
   wherein a pixel group and a compensating pixel are in the bending area, the pixel group comprising the first, second, third, and fourth pixels, the compensating pixel being formed at an edge of the bending area and being configured to create uniformity of display quality in the flat area and the bending area.

2. The bent edge display device of claim 1, wherein the compensating pixel emits the same color light as one of the first pixel, the second pixel, and the third pixel.

3. The bent edge display device of claim 1, wherein a size of the compensating pixel is the same as a size of the first pixel, a size of the second pixel, and a size of the third pixel.

4. The bent edge display device of claim 1, wherein a size of the compensating pixel is different from a size of the first pixel, a size of the second pixel, and a size of the third pixel.

5. The bent edge display device of claim 1, wherein the pixel group is arranged in a stripe structure.

6. The bent edge display device of claim 1, wherein the pixel group is arranged in a pentile structure.

7. A bent edge display panel comprising:
   a flat area in which pixel groups are repeatedly formed in a first direction and in a second direction perpendicular to the first direction, each of the pixel groups comprising a first pixel, a second pixel, a third pixel, and a fourth pixel; and
   a bending area extending and being bent from the flat area along the first direction,
   wherein a pixel group from among the pixel groups and a compensating pixel are in the bending area, the compensating pixel being formed at an edge of the bending area and being configured to create uniformity of display quality in the flat area and the bending area.

8. The bent edge display panel of claim 7, wherein the compensating pixel emits the same color light as one of the first pixel, the second pixel, and the third pixel.

9. The bent edge display panel of claim 7, wherein a size of the compensating pixel is the same as a size of the first pixel, a size of the second pixel, and a size of the third pixel.

10. The bent edge display panel of claim 7, wherein a size of the compensating pixel is different from a size of the first pixel, a size of the second pixel, and a size of the third pixel.

11. The bent edge display panel of claim 7, wherein the first, second, and third pixels have the same size as each other.

12. The bent edge display panel of claim 11, wherein each of the first pixel, the second pixel, and the third pixel has a rectangular shape, and
    wherein the first pixel, the second pixel, and the third pixel are sequentially arranged in the first direction.

13. The bent edge display panel of claim 11, wherein the fourth pixel has the same size as the first pixel, the second pixel, and the third pixel.

14. The bent edge display panel of claim 13, wherein the compensating pixel emits the same color light as one of the first pixel, the second pixel, the third pixel, and the fourth pixel.

15. The bent edge display panel of claim 13, wherein each of the first pixel, the second pixel, the third pixel, and the fourth pixel has a rectangular shape, and
    wherein the first pixel, the second pixel, the third pixel, and the fourth pixel are sequentially arranged in the first direction.

16. The bent edge display panel of claim 7, wherein the first, second, and third pixels have different sizes from each other.

17. The bent edge display panel of claim 16, wherein each of the first pixel, the second pixel, and the third pixel has a diamond shape, and
    wherein the first pixel, the second pixel, and the third pixel are arranged in the first direction and the second direction.

18. The bent edge display panel of claim 16, wherein each of the first pixel, the second pixel, and the third pixel has a rectangular shape, and wherein the first pixel, the second pixel, and the third pixel are arranged in the first direction and the second direction.

19. The bent edge display panel of claim 7, wherein the pixel groups are arranged in a stripe structure.

20. The bent edge display panel of claim 7, wherein the pixel groups are arranged in a pentile structure.

* * * * *